(12) United States Patent
Phillips et al.

(10) Patent No.: US 6,804,117 B2
(45) Date of Patent: *Oct. 12, 2004

(54) THERMAL BUS FOR ELECTRONICS SYSTEMS

(75) Inventors: Alfred L. Phillips, Pine Grove, PA (US); Dmitry K. Khrustalev, Lancaster, PA (US); Kevin L. Wert, Oak Creek, WI (US); Michael J. Wilson, Racine, WI (US); Jonathan P. Wattelet, Gurnee, IL (US); John Broadbent, Mancetter (GB)

(73) Assignee: Thermal Corp., New Stanton, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/628,645

(22) Filed: Jul. 28, 2003

(65) Prior Publication Data

US 2004/0037045 A1 Feb. 26, 2004

Related U.S. Application Data

(60) Provisional application No. 60/403,444, filed on Aug. 14, 2002.

(51) Int. Cl.7 .................................................. H05K 7/20
(52) U.S. Cl. ........................ 361/700; 361/699; 361/719; 361/721; 257/715; 174/15.2; 165/80.4; 165/104.26; 165/104.33
(58) Field of Search ................................. 361/699, 700, 361/711, 719–721, 724; 257/714, 715; 174/15.2; 165/80.4, 104.26, 104.33

(56) References Cited

U.S. PATENT DOCUMENTS

| | | | |
|---|---|---|---|
| 4,366,526 A | | 12/1982 | Lijoi et al. |
| 4,449,576 A | * | 5/1984 | Baum et al. ............ 165/104.33 |
| 4,819,713 A | | 4/1989 | Weisman |
| 4,931,905 A | | 6/1990 | Cirrito et al. |
| 5,224,016 A | | 6/1993 | Weisman et al. |
| 5,283,715 A | | 2/1994 | Carlsten et al. |
| 5,829,516 A | | 11/1998 | Lavochkin |
| 5,884,693 A | | 3/1999 | Austin et al. |
| 5,890,371 A | | 4/1999 | Rajasubramanian et al. |
| 6,055,157 A | | 4/2000 | Bartilson |
| 6,076,595 A | | 6/2000 | Austin et al. |
| 6,388,882 B1 | | 5/2002 | Hoover et al. |
| 6,536,510 B2 | | 3/2003 | Khrustalev et al. |
| 6,621,713 B2 | * | 9/2003 | Amaike et al. ............. 361/797 |
| 6,643,132 B2 | * | 11/2003 | Faneuf et al. ............... 361/700 |
| 6,657,121 B2 | * | 12/2003 | Garner ....................... 174/16.3 |

* cited by examiner

Primary Examiner—Boris Chervinsky
(74) Attorney, Agent, or Firm—Duane Morris LLP

(57) ABSTRACT

A thermal management system for an electronic device is provided a first thermal energy transfer assembly that is thermally coupled between a heat generating structure located on a circuit card and a first thermal interface surface that is spaced away from the heat generating structure. A second thermal energy transfer assembly includes a second thermal interface surface which is arranged in confronting relation to the first thermal interface surface. A clamping mechanism is arranged to move the second thermal interface surface between (i) a first position that is spaced away from the first thermal interface surface, and (ii) a second position wherein the second thermal interface surface is pressed against the first thermal interface surface so as to allow the busing of thermal energy from the first thermal energy transfer assembly to the second thermal energy transfer assembly by heat transfer from the first thermal interface surface to the second thermal interface surface.

38 Claims, 17 Drawing Sheets

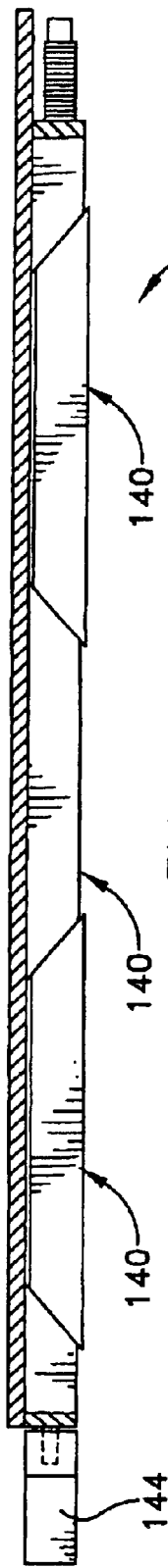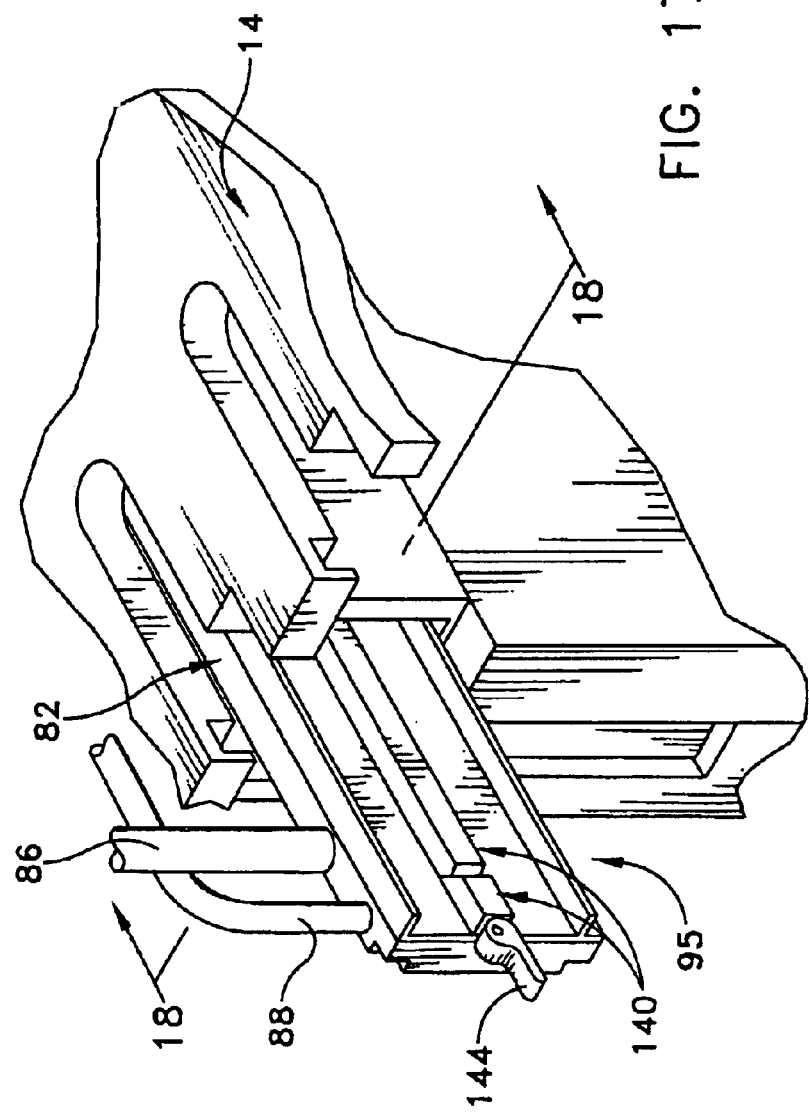

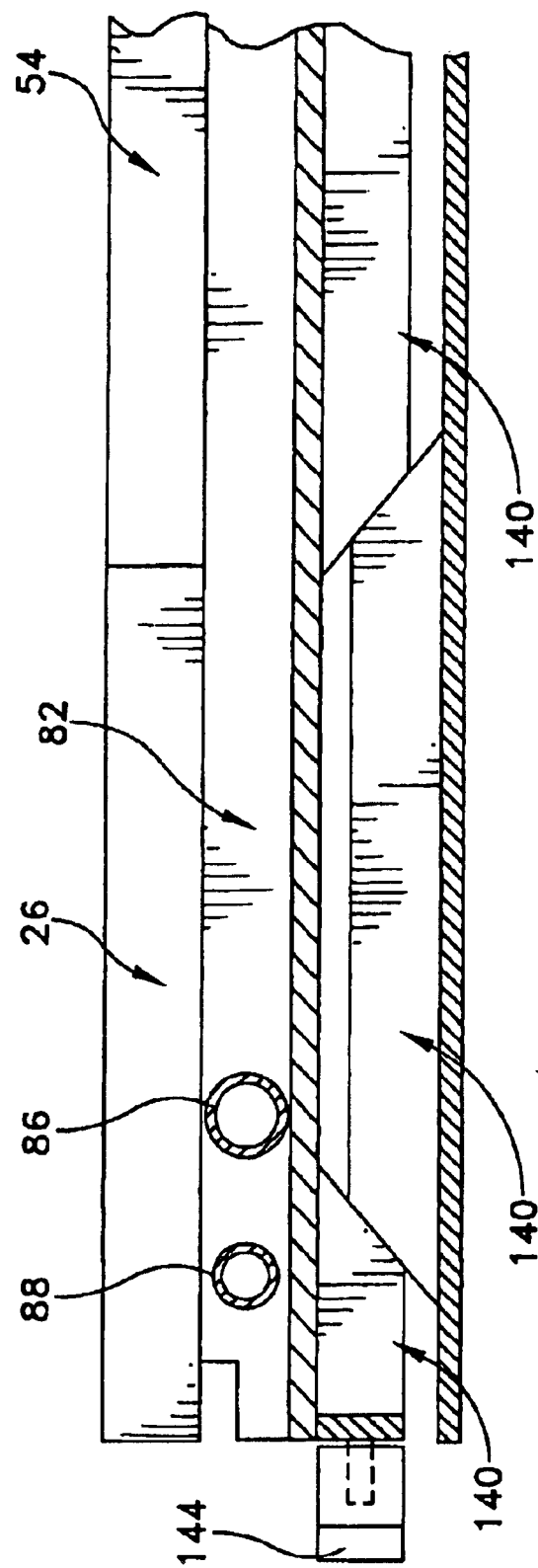

THERMAL BUS FOR ELECTRONICS SYSTEMS

CROSS-REFERENCE TO RELATED APPLICATIONS

This application claims the benefit of U.S. Provisional Application No. 60/403,444, filed Aug. 14, 2002.

FIELD OF THE INVENTION

The present invention generally relates to heat management systems for high power electronics equipment, and more particularly to a thermal bus system for a cabinet housing high power, high thermal profile electronic components and systems.

BACKGROUND OF THE INVENTION

In many electronic systems, the efficient cooling of electronic components has become a significant problem. With the advent of large-scale integrated circuit (IC) modules containing many thousands of circuit elements, it has become possible to pack great numbers of electronic components together within a very small volume. As is well known, these integrated circuit modules generate significant amounts of heat during the course of their normal operation. Since most solid state devices are sensitive to excessive temperatures, a solution to the problem of the generation of heat by large scale IC's in close proximity to one another has become of increasing concern to industry.

A typical prior art approach to cooling electronic components is to direct a stream of cooling air across the modules and/or circuit cards carrying such devices. However, the increasing power density of electronic systems is reaching the point where it is no longer possible to adequately cool heat generating electronic components by forcing air over them. Power densities are anticipated to reach the point where it is physically impossible to force sufficient ambient temperature air through a cabinet to adequately cool the electronics inside. Several other disadvantages to this approach have also been identified, including: high pressure drop; uniformity of component form factors; placing the components containing the integrated circuits further apart on the circuit cards; increasing the distance between circuit cards; and increasing the volume and velocity of cooling air directed over the components. This required increase in volume and velocity of cooling air requires special considerations in the design of the housings containing the circuit cards and in the mechanical systems for delivering the cooling air. Also, the air quality (moisture content, contamination, etc.) must be tightly controlled to inhibit corrosion, loss of cooling effectiveness, etc. Thus, cooling of components by this means necessitates a number of compromises to the overall system that prevent its use in many systems.

The foregoing thermal management problems have brought about the evolution of other techniques for cooling card-mounted electronic components. For example, one technique includes the use of solid metal thermal mounting cards or plates which conduct the heat dissipated by electronic components to a heat sink (cold plate) disposed at the edge of each circuit card. Such an approach, however, results in a large thermal resistance from the component mounting surface to the heat sink, which causes high component temperatures.

Other known techniques for cooling electronic systems include loop thermosyphons and heat pipes. Loop thermosyphons are devices that use gravity to maintain two-phase fluid circulation during operation. Each loop thermosyphon has an evaporator, where vaporization occurs when it is heated, a vapor tube through which the vapor flows to a condenser where it is cooled and condenses, and a liquid return tube to return the liquid to the evaporator. Sometimes a capillary structure is used in the evaporator to reduce its thermal resistance.

A heat pipe includes a sealed envelope that defines an internal chamber containing a capillary wick and a working fluid capable of having both a liquid phase and a vapor phase within a desired range of operating temperatures. When one portion of the chamber is exposed to relatively high temperature it functions as an evaporator section. The working fluid is vaporized in the evaporator section causing a slight pressure increase forcing the vapor to a relatively lower temperature section of the chamber (a condenser section). The vapor is condensed in the condenser section and returns through the capillary wick to the evaporator section by capillary pumping action. Because a heat pipe operates on the principle of phase changes rather than on the principles of conduction or convection, a heat pipe is theoretically capable of transferring heat at a much higher rate than conventional heat transfer systems. Consequently, heat pipes have been utilized to cool various types of high heat-producing apparatus, such as electronic equipment (See, e.g., U.S. Pat. Nos. 5,884,693, 5,890,371, and 6,076,595).

U.S. Pat. No. 4,366,526, issued to Lijol et al., discloses a circuit card for high-density packaging of electronic components for use in high power-density card racks in computer and other electronic and avionic systems. The card has an all metal construction with an elongate planar body for the mounting of electronic components on opposite sides, and has a heat pipe located along the edges of one elongate side and two ends. Edge tabs on the ends of the card permit the card to be installed into a card rack in electronic equipment. The elongate portion of the heat pipe serves as the evaporator section and the two end portions act as the condensing sections.

U.S. Pat. No. 4,931,905, issued to Cirrito et al., discloses two metal plates that have U-shaped grooves so that the plates may form congruent halves wherein matching grooves complete independent heat pipes. A bight section of each heat pipe serves as an evaporator section while the parallel arms of each heat pipe form condenser sections. A wick is positioned within each heat pipe to improve liquid transport when a module is in a non-upright position. The condenser sections are located coincident with the normally upright edges of each module so that, when the module is upright, the vertically disposed condenser sections of the heat pipe provide gravity-assisted liquid transport to the evaporator section.

U.S. Pat. No. 5,283,715, issued to Carlsten et al., discloses a heat pipe structure that is incorporated directly into the metal base plate of a circuit card thereby eliminating thermal contact resistance between the base plate and the heat pipe assembly. Components are mounted on a copper circuit layer bonded to a dielectric layer in a first portion of the base plate with a second portion of the base plate/heat pipe assembly extending into a heat sink/cold plate condensing area for removal of heat generated in the component portion.

U.S. Pat. No. 6,055,157, issued to Bartilson, discloses a computer module that includes a first heat pipe assembly having an evaporator plate with an evaporator surface. The first heat pipe also has a condenser in fluid communication with the evaporator plate. The evaporator plate is positioned adjacent a printed circuit board populated with at least one electronic component. When a printed circuit board having components on two sides is used, a second heat pipe having the same construction is positioned adjacent the other side of the printed circuit board so that the electronic components on the other side are positioned adjacent the evaporator surface of the second heat pipe. The evaporator plate of each heat pipe is connected to the condenser by a plurality of necked-down regions. This forms at least one window between the condenser and the evaporator plate of each heat pipe. When more than one heat pipe is used in the computing module, the windows of the various heat pipes align.

U.S. Pat. No. 6,388,882, issued to Hoover, et al., discloses a thermal energy management architecture for a functioning system of electronic components and subsystems comprising a hierarchical scheme. Here the thermal management components are operatively engaged with individual portions of the system of electronic components and subsystems, in multiple defined levels, and are substantially only thermally driven, i.e., heat transfer devices that have no moving parts and require no external power for their operations.

U.S. Pat. No. 6,536,510, issued to Khrustalev, et al., discloses a thermal bus for cabinets housing high power electronics equipment that includes two spaced-apart horizontally oriented parallel evaporators interconnected in flow communication with a condenser. Each evaporator is mounted in a support having a central recess and each having a tube having a capillary wick disposed on an internal surface and being mounted within the central recess of the support. Each of the tubes includes a closed distal end and a closed proximal end with a liquid-working fluid entrance port located at the closed proximal end of the first tube and a vaporous-working fluid exit port located at the closed proximal end of the second tube. A duct defining a central passageway and having a capillary wick disposed on the walls of the central passageway is disposed in fluid communication with the first tube and the second tube. The condenser has a vaporous-working fluid entrance port disposed in flow communication with the vaporous-working fluid exit port of the evaporator and a liquid-working fluid exit port disposed in flow communication with the liquid-working fluid entrance port of the evaporator so that a working fluid cycles; (i) through the two spaced-apart parallel evaporators, and (ii) between the condenser and the two tubes.

SUMMARY OF THE INVENTION

The present invention provides a thermal management system that passively collects waste heat from individual or groups of components and passively transports that heat to a more advantageous location where it can physically be removed by forced air, or to a location inside or outside a cabinet housing the electronic systems, where it can be transferred to an external cooling circuit or sink that may be a significant distance from the electronic system. The thermal management system of the present invention employs heat pipes and other means to collect heat from components on a circuit card and transport that heat to a thermal connector located on a card shell. The thermal management system provides a mating thermal connector which is mounted within a cabinet or chassis, and provides the means to transport heat from the circuit card to a location where it can be removed. The location may be an area within the cabinet where a sufficiently large heat sink can transfer the heat to circulated air, or may be external to the cabinet where heat can be removed by circulating liquid loops or HVAC chiller circuits.

The present invention provides a thermal bus junction arranged within an electronics system for transporting thermal energy in a directed manner from one location to another location by positioning a cold plate, having a portion of at least one heat pipe embedded within a first thermal interface surface of it, adjacent to an evaporator portion of a loop thermosyphon having a second thermal interface surface so that the second thermal interface surface is releasably pressed against the first thermal interface surface. A condenser of a first loop thermosyphon having a first thermal interface surface may also be arranged adjacent to an evaporator portion of a loop thermosyphon having a second thermal interface surface so that the second thermal interface surface is releasably pressed against the first thermal interface surface. Likewise, a cold plate having a portion of at least one heat pipe embedded within a first thermal interface surface and a condenser of a first loop thermosyphon having a second thermal interface surface may be arranged adjacent to an evaporator portion of a second loop thermosyphon having a third thermal interface surface that is releasably pressed against the first and second thermal interface surfaces.

In one embodiment, the present invention provides a thermal management system for an electronic device having one or more circuit cards arranged within an enclosure. A first thermal energy transfer assembly is thermally coupled between a heat generating structure located on a circuit card and a first thermal interface surface that is spaced away from the heat generating structure. A second thermal energy transfer assembly includes a second thermal interface surface which is arranged in confronting relation to the first thermal interface surface. A clamping mechanism is arranged to move the second thermal interface surface between (i) a first position that is spaced away from the first thermal interface surface, and (ii) a second position wherein the second thermal interface surface is pressed against the first thermal interface surface so as to allow the busing of thermal energy from the first thermal energy transfer assembly to the second thermal energy transfer assembly by heat transfer from the first thermal interface surface to the second thermal interface surface.

In another embodiment of the invention, a thermal management system is provided having at least one card-level cooling assembly including at least one loop thermosyphon having a first thermal interface surface disposed upon a condenser. At least a second loop thermosyphon is provided having a second thermal interface surface disposed upon a second evaporator and arranged in confronting relation to the first thermal interface surface. A clamping mechanism is arranged to move the second thermal interface surface between (i) a first position that is spaced away from the first thermal interface surface, and (ii) a second position wherein the second thermal interface surface is pressed against the first thermal interface surface so as to allow the busing of thermal energy from the at least one card-level cooling assembly to the at least a second loop thermosyphon by heat transfer from the first thermal interface surface to the second thermal interface surface.

In yet a further embodiment of the invention, a thermal management system is provided having a first thermal energy transfer assembly that is thermally coupled between a heat generating structure located on a circuit card and a first thermal interface surface that is spaced away from the heat generating structure. A second thermal energy transfer assembly is provided that is thermally coupled between a heat generating structure located on a circuit card and a second thermal interface surface that is spaced away from the heat generating structure. A third thermal energy transfer assembly having a third thermal interface surface arranged in confronting relation to the first and second thermal interface surfaces. A clamping mechanism is arranged to move the third thermal interface surface between (i) a first position that is spaced away from the first and second thermal interface surfaces, and (ii) a second position wherein the third thermal interface surface is pressed against the first and second thermal interface surfaces so as to allow the busing of thermal energy from the first and second thermal energy transfer assemblies to the third thermal energy transfer assembly by heat transfer from the first and second thermal interface surfaces to the third thermal interface surface.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein:

FIG. 16 is an elevational view of a typical clamping mechanism used in connection with the present invention;

FIG. 17 is a broken-away perspective view of portions of a rack-level cooling assembly and clamping mechanism arranged in accordance with the present invention just prior to full insertion into a rack housing;

FIG. 20 is a broken-away, top elevational view of the present invention showing the final stage in the process of clamping a rack-level cooling assembly evaporator against a thermal connector portion and thermosyphon condenser portion of a card shell in accordance with the present invention.

DETAILED DESCRIPTION OF THE PREFERRED EMBODIMENT

Figure 1:
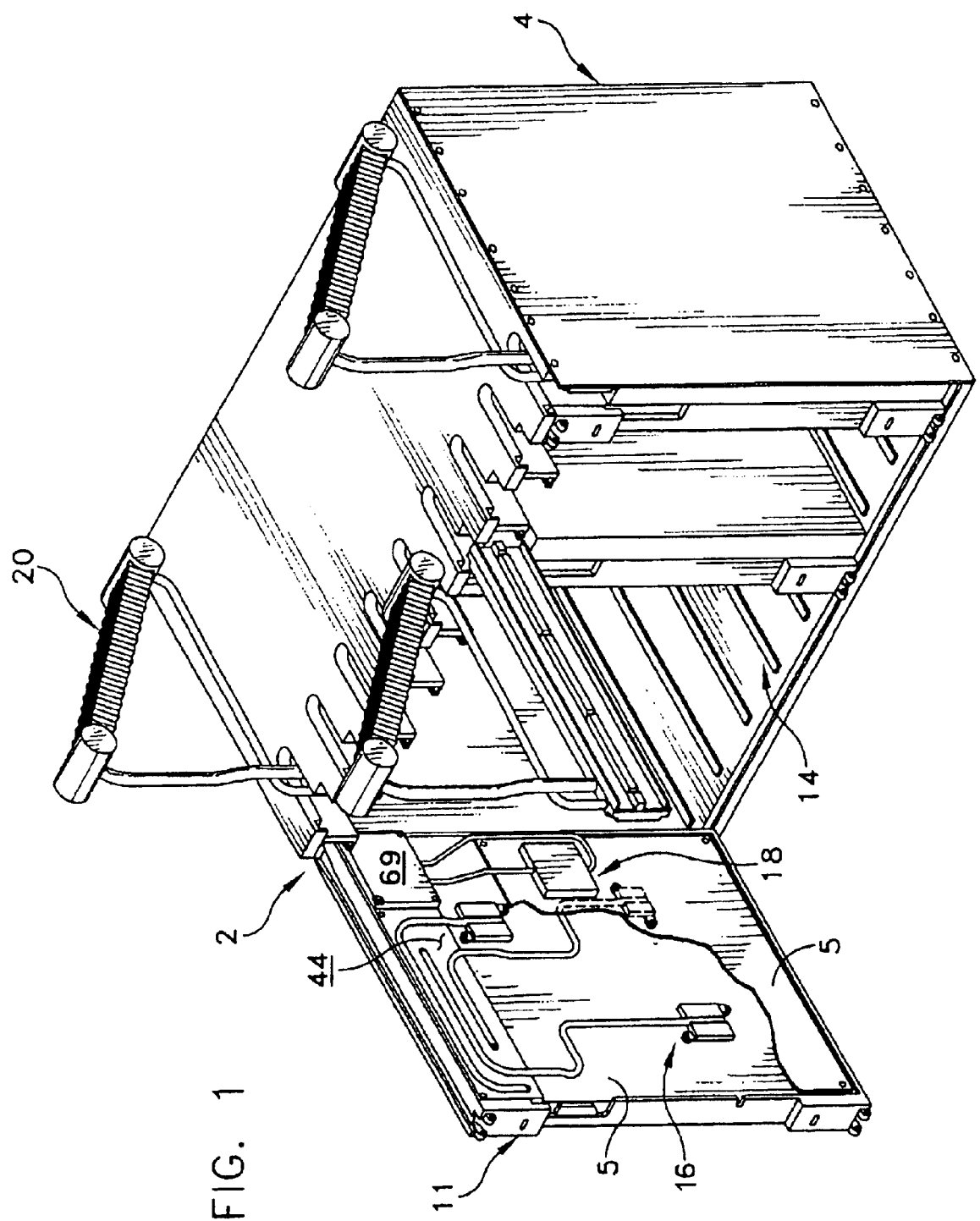
FIG. 1 is an exploded perspective view of a thermal management system formed in accordance with the present invention.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. Terms such as "busing, buses, or bus" refer to the transport of thermal energy in a directed manner from one location to another location, and the structures related to that transference of thermal energy. In the claims, means-plus-function clauses are intended to cover the structures described, suggested, or rendered obvious by the written description or drawings for performing the recited function, including not only structural equivalents but also equivalent structures.

The present invention provides a thermal management system 2 that may be implemented in a functioning electronic system 4 (e.g., a server, local exchange, or the like) comprising electronic components and/or subsystems of such components that are mounted to printed wiring boards 5. One or more printed wiring boards 5 are often assembled together within a card shell or pack 11 (also referred to in the art as circuit cards, chassis, cases or "packs") that is sized and shaped for mounting within a rack housing 14 (FIG. 1). Card shell 11 is sometimes also used to shield against electromagnetic interference (EMI) as well as to provide protection against physical damage or contamination.

Thermal management system 2 comprises a hierarchical scheme of heat transfer devices that are operatively engaged with individual or groups of heat generating components that form electronics system 4. Of course, as such systems of electronic components and subsystems increase in complexity, and the use of new electronic or optical technologies are incorporated, the number and constituency of such a thermal management scheme will change, all without deviating from the present invention.

Figure 2:
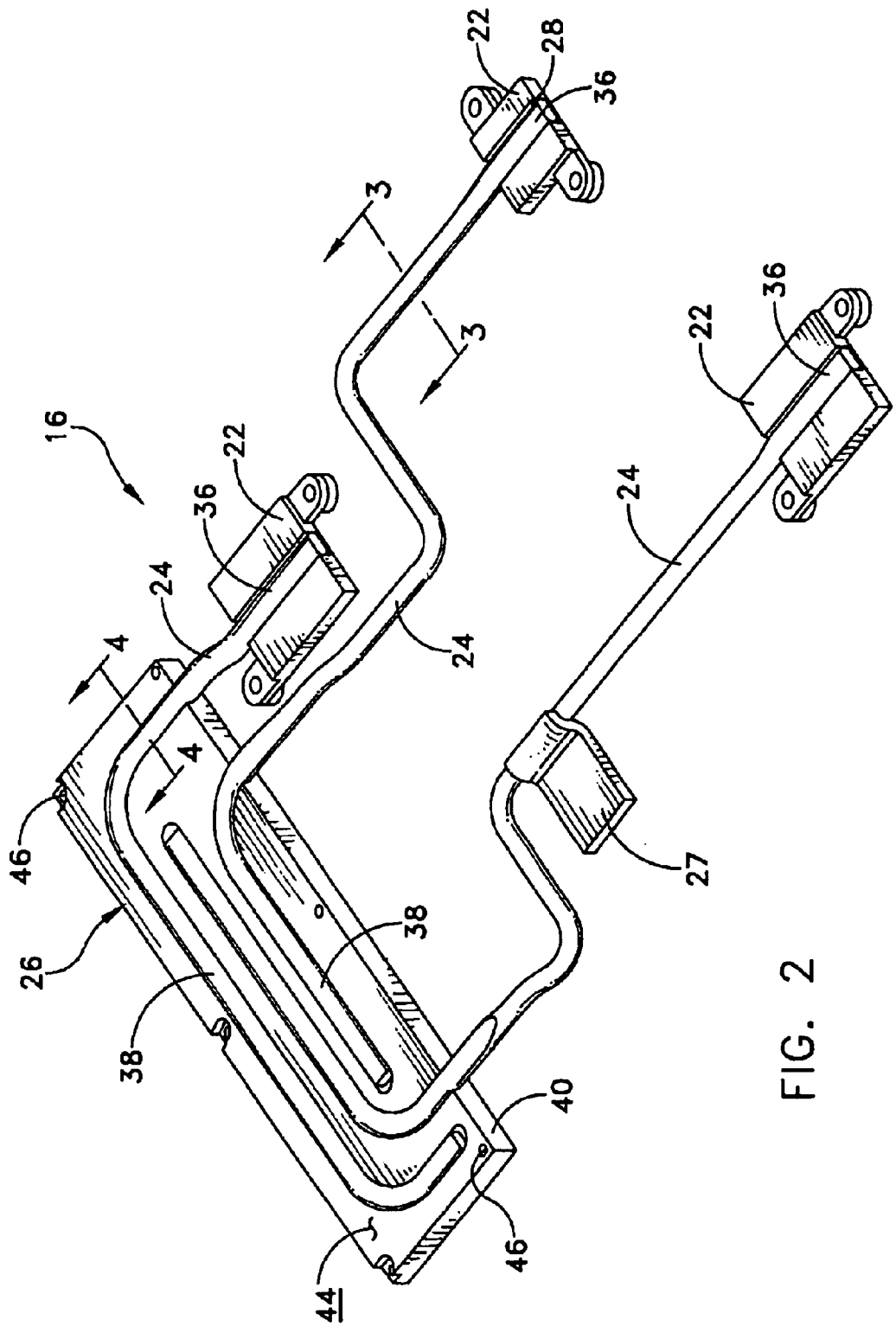
FIG. 2 is a perspective view of a first card-level cooling assembly formed in accordance with the present invention.

Referring to FIGS. 1 and 2, a thermal management system 2 formed in accordance with the present invention comprises a first card-level cooling assembly 16, a second card-level cooling assembly 18, and a rack-level cooling assembly 20. More particularly, first card level cooling assembly 16 comprises one or more thermal saddle heat sinks 22, one or more heat pipes 24, and a thermal connector 26. Each thermal saddle 22 is positioned atop an active, heat generating electronic component, e.g., a processor chip, voltage regulator, power chip, etc. (not shown), to conductively receive operating heat during operation of electronic system 4. A recessed slot 28 is defined in the top surface of each thermal saddle 22 so as to receive an evaporator portion of a heat pipe 24. A heat pipe 24 which cools a large discrete heat source, e.g., a processor chip, can also readily cool additional small heat sources, e.g., I/O modules, voltage regulators, etc., by attaching thermally conductive flags 27 to heat pipe 24 which provide a thermally conductive path. It will be understood that flags 27 may themselves also be heat pipes.

Figure 4:
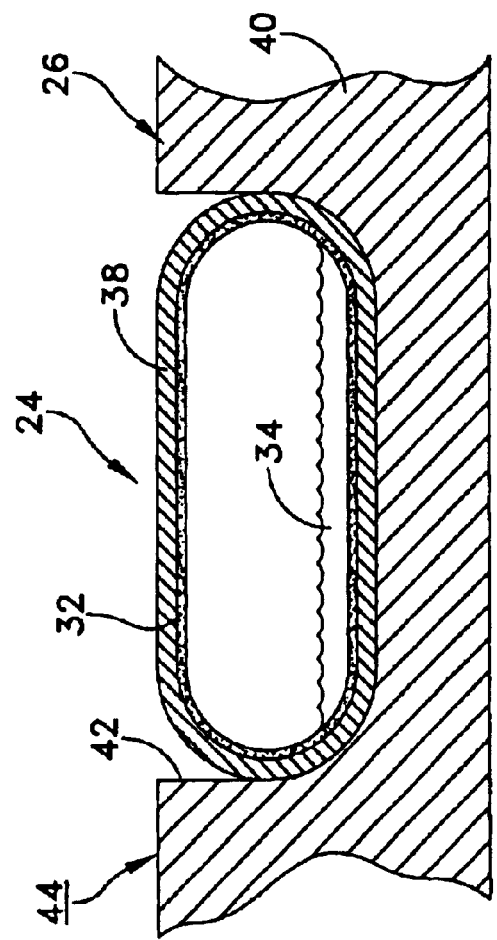
FIG. 4 is a broken-away cross-sectional view of the heat pipe and thermal connector shown in FIG. 2, as taken along lines 4—4 in FIG. 2.
Figure 3:
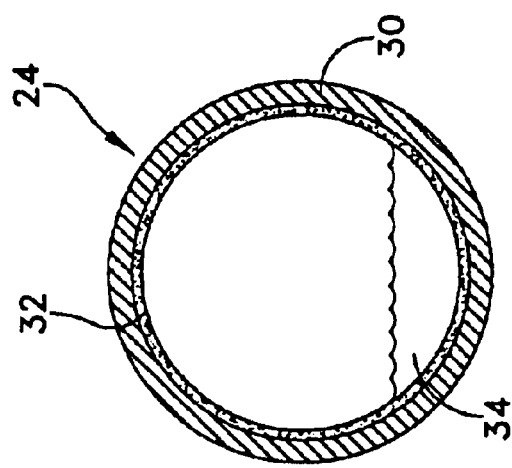
FIG. 3 is a cross-sectional view of the heat pipe shown in FIG. 2, as taken along lines 3—3 in FIG. 2.

Heat pipes 24 comprise a vacuum tight tube 30, a wick 32, and a working fluid 34 (FIGS. 2, 3, and 4). Tube 30 is formed so as to comprise a partially flattened evaporation end 36 and a partially flattened condensation end 38. Tube 30 is often a relatively long, somewhat flattened cylinder formed from a thermally conductive material, that is capable of maintaining a vacuum, e.g., copper, aluminum, or their alloys, monel, silicon stainless steel, silicon carbide, or the like,. A vapor space is defined by a central passageway extending along the longitudinal axis of vacuum tight tube 30.

Wick 32 may comprise adjacent layers of screening or a sintered powder structure with interstices between the particles of powder. Working fluid 34 may comprise any of the well known two-phase vaporizable liquids, e.g., water alcohol, freon, etc. Heat pipes 24 are formed according to the invention by drawing a partial vacuum within tube 30, and then back-filling with a small quantity of working fluid 34, e.g., just enough to saturate wick 32, just prior to final sealing of tube 30 by pinching and welding or otherwise hermetically sealing off both ends 36 and 38. The atmosphere inside heat pipe 30 is set by an equilibrium of liquid and vapor generated from working fluid 34.

Figure 7:
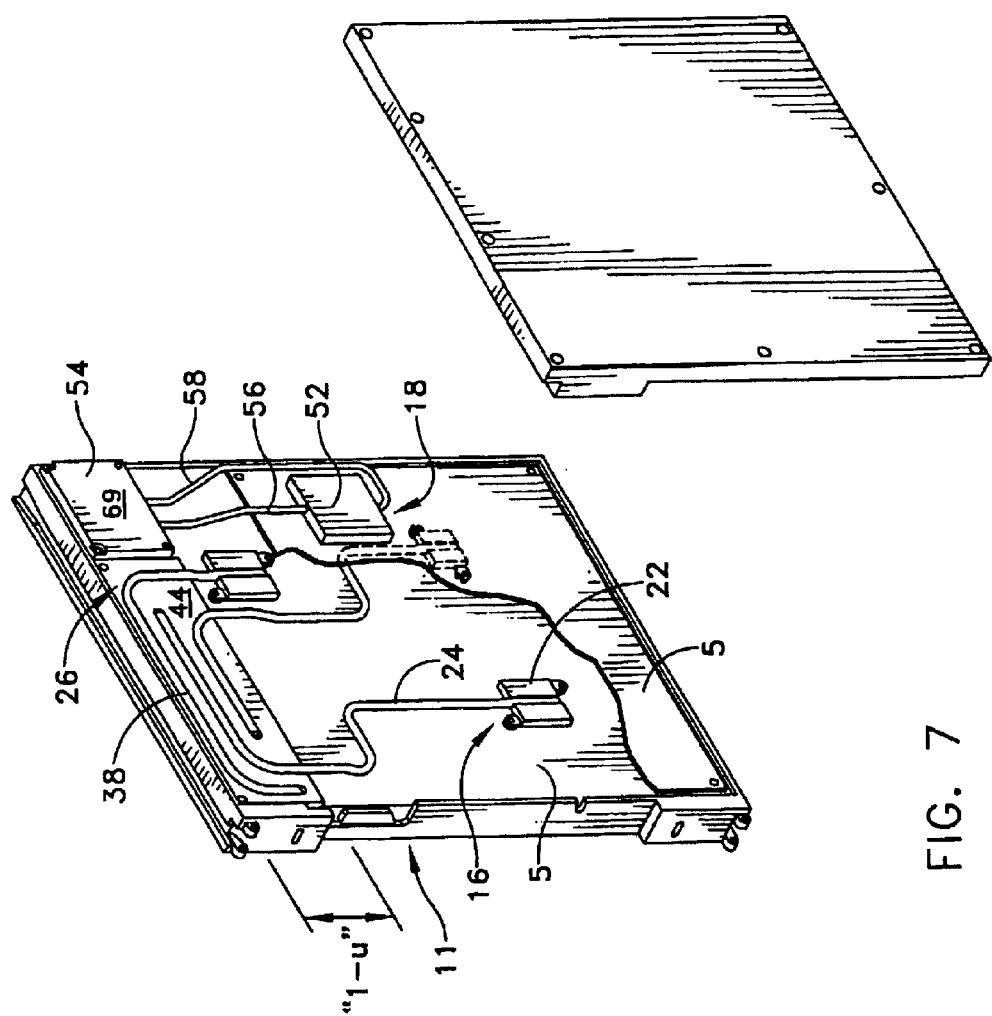
FIG. 7 is an exploded view of a card shell having first and second card-level cooling assemblies engaged with printed circuit boards located within the shell.

Thermal connector 26 comprises an aluminum or copper cold plate 40 that includes one or more channels 42 defined in a first thermal interface surface 44 of thermal management system 2. Cold plate 40 is often sized and shaped so as to be mounted within an edge portion of card shell 11. Thermal connector 26 comprises a first thermal transfer node via thermal transfer interface surface 44, between first card-level cooling assembly 16 and rack-level cooling assembly 20. The length of thermal transfer interface surface 44 may be approximately the width of card shell 11, or somewhat smaller, and the exposed height of thermal transfer interface surface 44 is preferably about one and three-quarter inches, often referred to in the art as "1-U" (FIG. 7). A thermal pad or thermal grease (not shown) may be disposed on thermal transfer interface surface 44 to improve the thermal contact with it. A plurality of mounting holes 46 are defined through cold plate 40, and are sized and shaped to accept conventional fasteners. Preferably, channels 42 are substantially U-shaped, and have a substantially semi-circular bottom portion that is sized and shaped to tightly receive partially flattened condensation ends 38 of heat pipes 24 (FIG. 4). Thermal energy is removed from discrete or clusters of heat generating electronic components through thermal saddles 22, and transported to thermal connector 26 by heat pipes 24 so that heat rejection to the ambient environment, or other heat sinks, may take place outside the vicinity of the circuit card or chassis.

Figure 6:
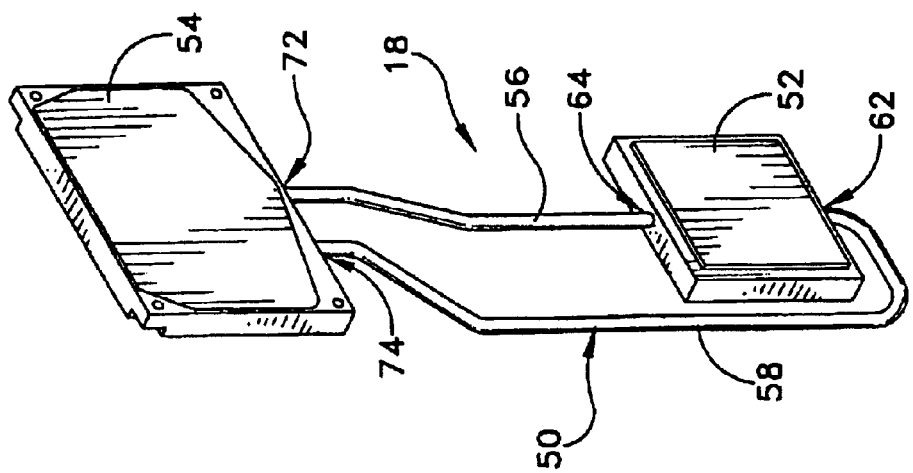
FIG. 6 is rear view of the second card-level cooling assembly shown in FIG. 5.
Figure 5:
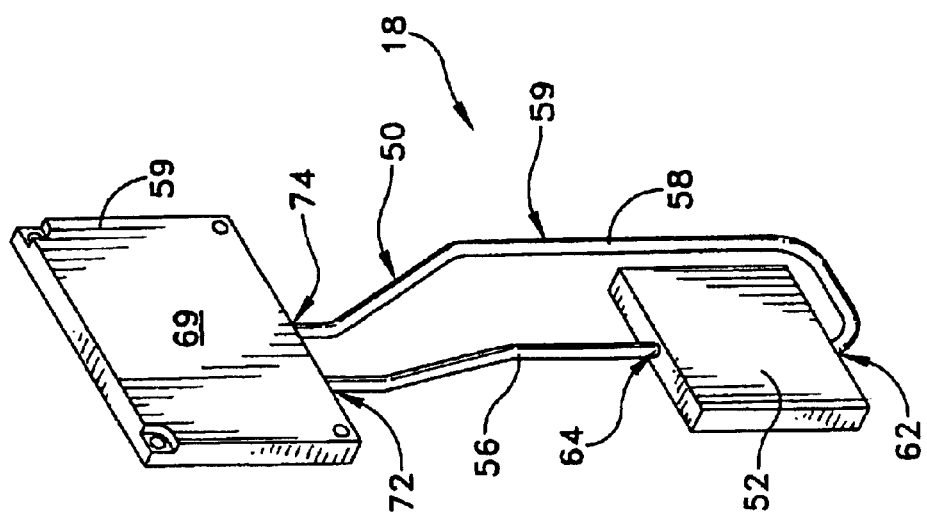
FIG. 5 is a perspective view of a second card-level cooling assembly formed in accordance with the present invention.

Referring to FIGS. 5 and 6, second card-level cooling assembly 18 often comprises a loop thermosyphon 50 that includes an evaporator 52, a condenser 54, a vapor conduit 56, and a condensate conduit 58. One or more loop thermosyphons 50 may be employed for higher power heat sources, since for a given size, loop thermosyphon 50 can transport greater quantities of thermal energy than a heat pipe. Its use also helps to save space on crowded circuit cards. Evaporator 52 comprises, an inlet opening 62, and an outlet opening 64. Inlet opening 62 is arranged in flow communication with condenser 54, via condensate conduit 58, and outlet opening 64 is arranged in flow communication with condenser 54, via vapor conduit 56. Evaporator 52 is arranged in intimate thermal engagement with a source of thermal energy, such as an integrated circuit chip or chips, or an electronic device comprising such chips or other heat generating structures known in the art and located on a printed wiring board 5 within card shell 11. Evaporator 52 may include external and/or internal features and structures to aid in the rapid vaporization of a coolant fluid (not shown). For example, an externally applied thermally conductive coating may used to enhance heat transfer and spreading from the heat source throughout evaporator 52, or a sintered internal surface coating or heat pipe structures may be included in evaporator 52 for the purpose of spreading and transferring heat, generated by the electronic components, evenly throughout evaporator 52.

Loop thermosyphon 50 is charged with a suitable coolant fluid, e.g., water, freon, alcohol, acetone, or some other fluid known in the art for use in heat transfer devices, and which is capable of rapid vaporization and condensation within a closed loop environment. Parameters to be considered when selecting a suitable coolant fluid include the amount of pressure that can be safely applied to evaporator 52, the operating temperature of the equipment to be cooled, the rate of heat transfer, the temperatures reached within evaporator 52, the viscosity of coolant fluid, and the boiling point of coolant fluid. Loop thermosyphon 50 is sealed to the ambient atmosphere so as to form a closed loop system.

Evaporator 52 acts as a heat exchanger transferring the heat given off by one or a cluster of electronic components to the coolant fluid. As the coolant fluid is heated, the pressure within evaporator 52 increases, vaporizing the coolant fluid. The vapor flows through vapor conduit 56, toward condenser 54. Evaporator 52 may comprise many known structures that are suitable for transferring thermal energy to the coolant fluid. Some types of evaporators that have been found to be useful when used in connection with this invention include, tube evaporators, rising film evaporators, falling film evaporators, plate evaporators, and layered wick evaporators. For example, in one embodiment of the invention, evaporator 52 comprises a layered wick evaporator, having a wick formed on its interior surface.

Vapor conduit 56 and condensate conduit 58 may have a conventional structure that is capable of transferring coolant fluid between evaporator 52 and condenser 54. For example, vapor conduit 56 and condensate conduit 58 may be separate structures (e.g., tubes or pipes), or may be formed from a single structure, e.g., multiple channels molded or cut into single or multiple blocks. Vapor conduit 56 and condensate conduit 58 may incorporate flexible sections 59 that permit the conduits to be folded for shipment, and to be bent and reconfigured during installation. The length of each flexible section 59 is determined by the needs of the specific application.

Condenser 54 typically comprises a closed container formed from a thermally conductive material, and defines a second thermal interface surface 69 on an outer side surface. Thermal transfer interface surface 69 comprises a second thermal transfer node between second card-level cooling assembly 18 and rack-level cooling assembly 20. The length of second thermal transfer interface surface 69 is often equal to the difference in length between first thermal transfer interface surface 44 and the width of card shell 11. The exposed height of second thermal interface surface 69 is preferably about one and three-quarter inches (FIG. 7). A thermal pad or thermal grease (not shown) may be disposed in the interface area to improve thermal contact. An inlet opening 72 and an outlet opening 74 are defined in edge portions of condenser 54. Inlet opening 72 is arranged in flow communication with evaporator 52, via vapor conduit 56, and outlet opening 74 is arranged in flow communication with evaporator 52, via condensate conduit 58. Condenser 54 acts as a heat exchanger transferring heat contained in a mixture of vaporous coolant fluid and liquid coolant fluid to rack-level cooling assembly 20.

Figure 8:
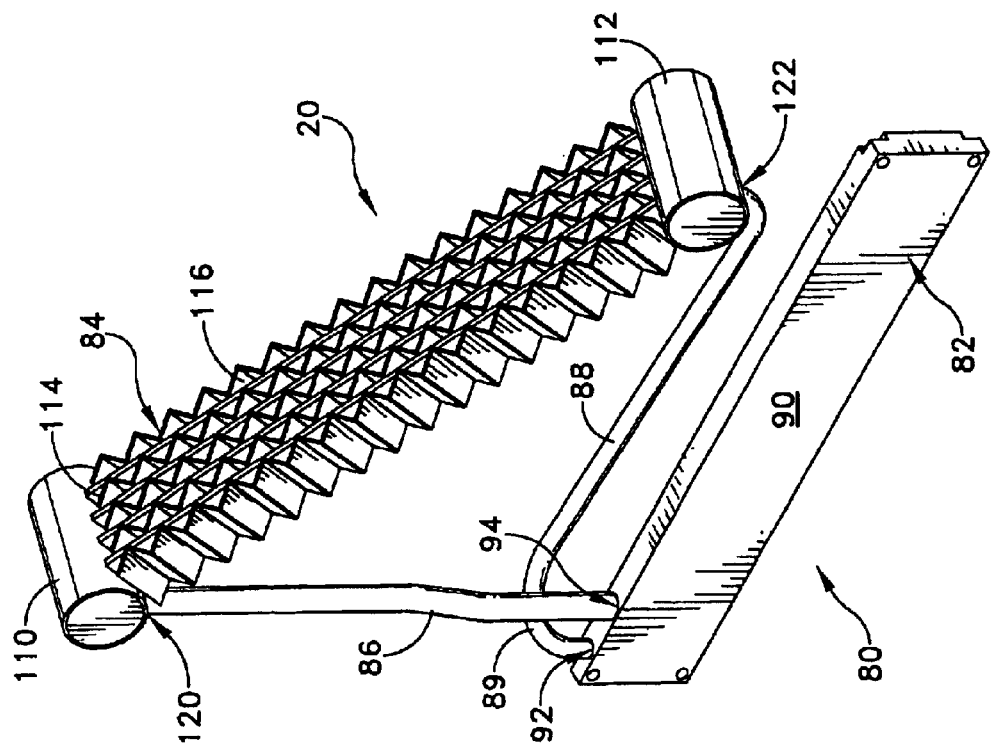
FIG. 8 is a perspective view of a rack-level cooling assembly formed in accordance with the present invention.
Figure 9:
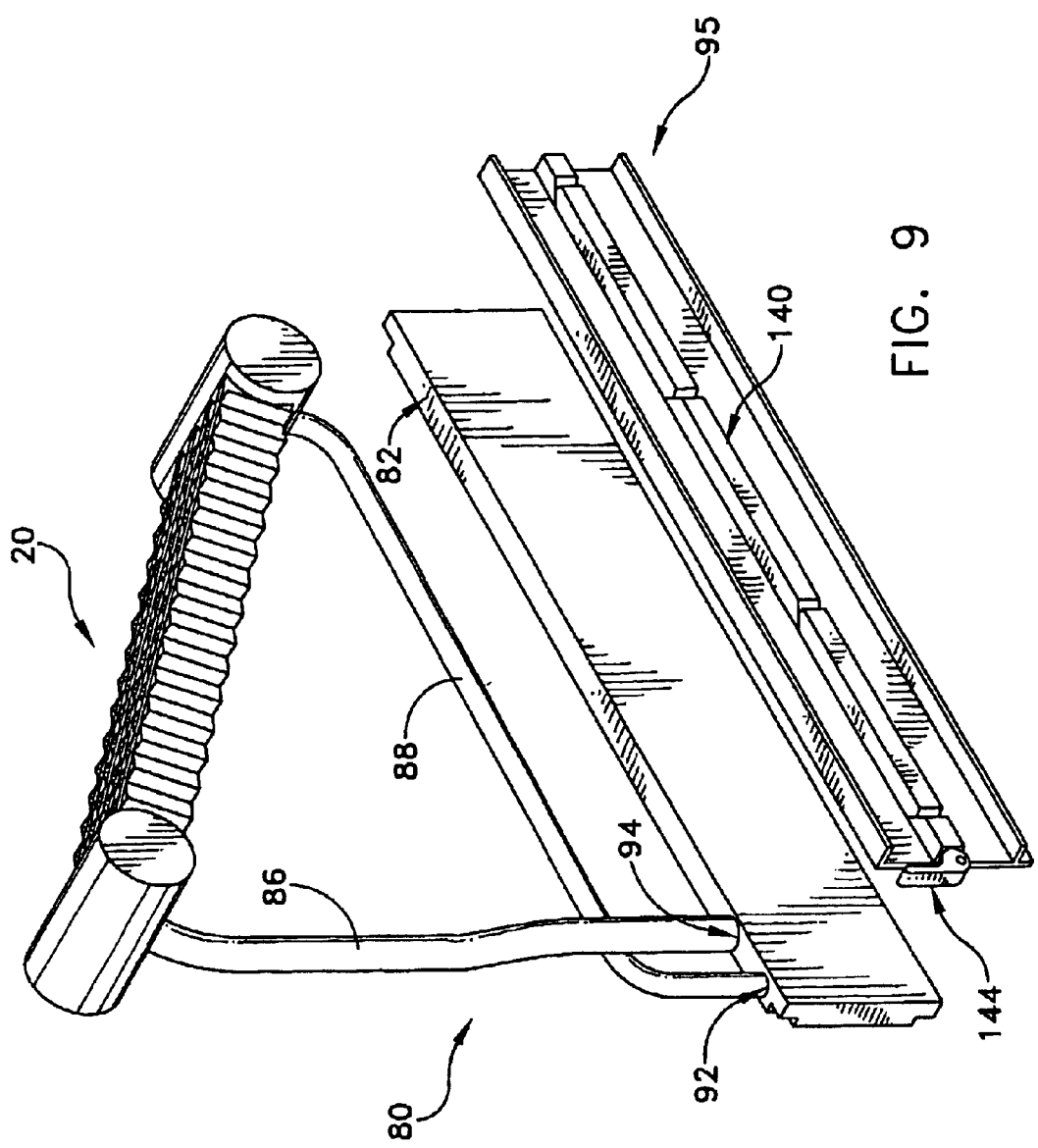
FIG. 9 is a perspective rear view of the rack-level cooling assembly shown in FIG. 8, and having a portion of a clamping assembly exploded away for clarity of illustration.

Referring to FIGS. 1, 8, and 9, rack-level cooling assembly 20 also comprises a plurality of modular loop thermosyphons 80 that each include an evaporator 82, a condenser 84, a vapor conduit 86, and a condensate conduit 88. Thermal transport at the rack or cabinet level is typically provided by a loop thermosyphon-type heat exchanger because of its greater transport capacity. However, conventional thermosyphons, heat pipes or loop heat pipes may be used as the application dictates. Evaporator 82 comprises a third thermal transfer interface surface 90, an inlet opening 92 and an outlet opening 94. Third thermal transfer interface surface 90 forms a thermal energy receptacle that is arranged to receive thermal energy from first card-level assembly 16, via thermal connector 26, and from second card-level assembly 18, via condenser 84. The length of third thermal transfer interface surface 90 is determined by the total width of card shell 11 (FIG. 7). The height of third thermal transfer interface surface 90 is preferably about one and three-quarter inches. Very often, third thermal transfer interface surface 90 is sized and shaped so as to be complementary to the combined size and shape of first thermal transfer interface surface 44 and second thermal transfer interface surface 69. Inlet opening 92 is arranged in flow communication with condenser 84, via condensate conduit 88, and outlet opening 94 is arranged in flow communication with condenser 84, via vapor conduit 86. Evaporator 82 may also include external and/or internal features and structures to aid in the rapid vaporization of a coolant fluid (not shown) such as an externally applied thermally conductive coating to enhance heat transfer, or a sintered internal surface coating or heat pipe structures for spreading and transferring heat evenly throughout evaporator 82.

In one alternative embodiment, a multiple card evaporator 96 includes a plurality of blade-evaporators 98 that extend from a common manifold 100 that is arranged in fluid communication with each blade-evaporator 98. In this embodiment, a single loop thermosyphon serves all the cards in a chassis or rack housing 14. Plurality of blade-evaporators 98 are often arranged in substantially perpendicular relation to common manifold 100, but are otherwise substantially similar to evaporator 82 in structure, components, and function. In this way, multiple card evaporator 96 provides one evaporator blade for each card shell 11 that can fit in rack housing 14. Each blade-evaporator 98 may contain a wick disposed on its interior surfaces. Blade-evaporators 98 of multiple card evaporator 96 are joined into common header manifold 100 so vapor exits the evaporators from a single vapor line 105. A single liquid line 106 returns condensate to common header manifold 100 which distributes the liquid to the individual blade-evaporators 98. Vapor line 105 and liquid line 106 incorporate flexible sections 107 to aid in installation. Each individual blade-evaporator 98 has the same interface geometry as evaporator 82. Although shown in the figures as a rigid extension of common header manifold 100, the blade/manifold interface 109 may employ flexible joint connections.

Loop thermosyphon 80 is also charged with a suitable coolant fluid, e.g., water, freon, alcohol, acetone, or some other fluid known in the art for use in heat transfer devices, and which is capable of rapid vaporization and condensation within a closed loop environment. Loop thermosyphon 80 is sealed from the ambient atmosphere so as to form a closed loop system. As coolant fluid is heated, the pressure within evaporator 82 increases, vaporizing the saturated fluid. The vapor flows through vapor conduit 86, toward condenser 84. Evaporator 82 may comprise many known structures that are suitable for transferring thermal energy to the coolant fluid. Some types of evaporators that have been found to be useful when used in connection with this invention include, tube evaporators, rising film evaporators, falling film evaporators, plate evaporators, and layered wick evaporators.

Vapor conduit 86 and condensate conduit 88 may have a conventional structure that is capable of transferring coolant fluid between evaporator 82 and condenser 84. For example, vapor conduit 86 and condensate conduit 88 may be separate structures (e.g., tubes or pipes), or may be formed from a single structure, e.g., multiple channels molded or cut into single or multiple blocks. Vapor conduit 86 and condensate conduit 88 may have varying lengths, and incorporate flexible sections 89 that permit the conduits to be folded for shipment, and to be bent and reconfigured during installation.

In one embodiment, condenser 84 comprises a vapor vessel 110, a liquid vessel 112, a plurality of conduits 114, and a plurality of fins 116, all formed from a suitably thermally conductive material. Vapor vessel 110 includes an inlet opening 120 and liquid vessel 112 includes an outlet opening 122. Inlet opening 120 is arranged in flow communication with evaporator 82, via outlet opening 94, and outlet opening 122 is arranged in flow communication with evaporator 82, via inlet opening 92. Plurality of conduits 114 comprise hollow, rectangular tubes that are arranged in spaced, parallel relation to one another, and in flow communication between vapor vessel 110 and liquid vessel 112. Plurality of fins 116 are positioned between adjacent conduits 114 so as to increase the available thermal conductor surface area and thereby enhance the transfer of thermal energy from vaporous and liquid coolant flowing between vapor vessel 110 and liquid vessel 112 under the force of gravity.

Figure 10:
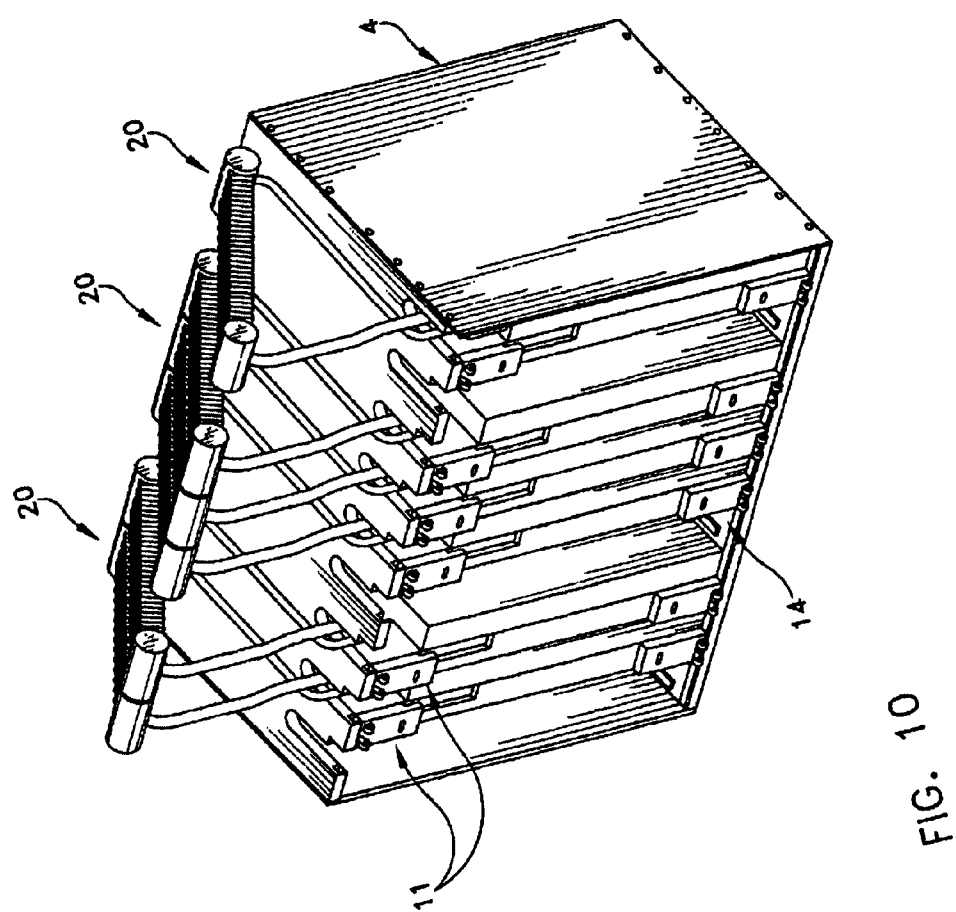
FIG. 10 is a perspective view of an electronic system that is partially populated with a plurality of modular thermal management systems formed in accordance with the present invention.
Figure 11:
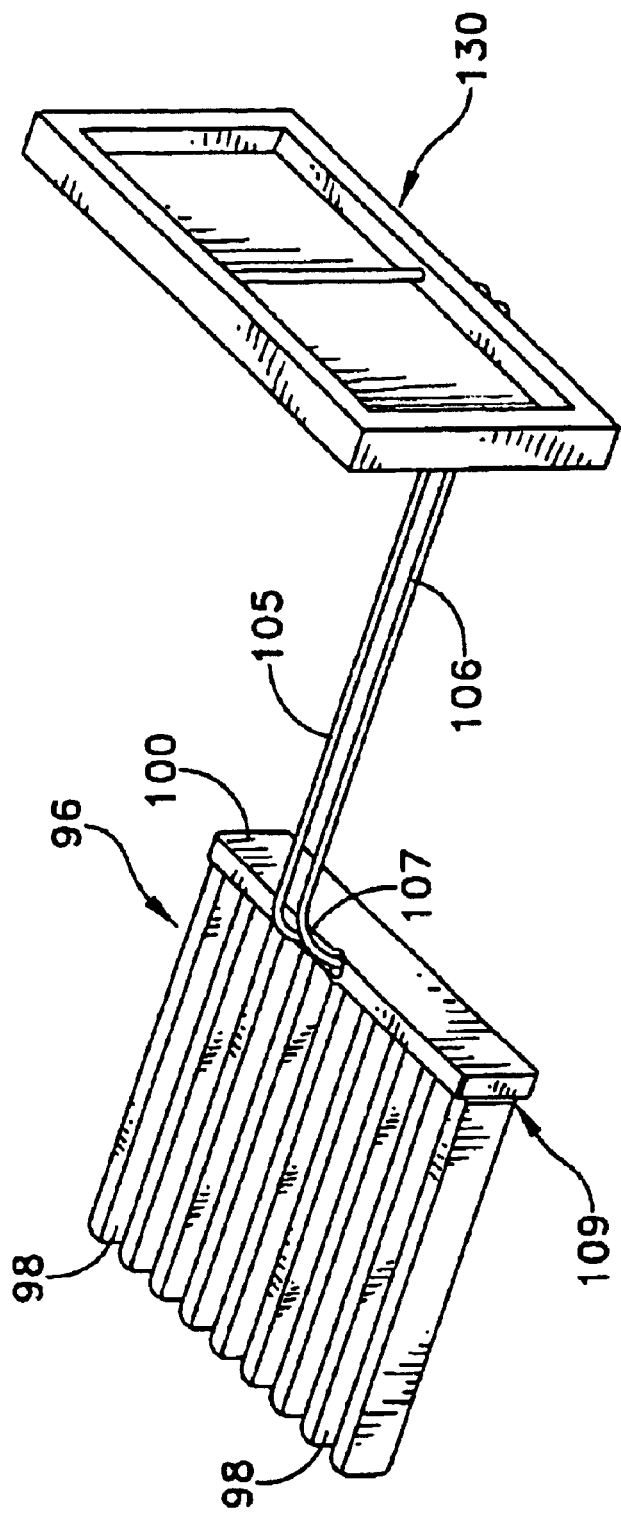
FIG. 11 is a perspective view of an alternative embodiment of evaporator blade and liquid cooled heat exchanger formed in accordance with the present invention.
Figure 12:
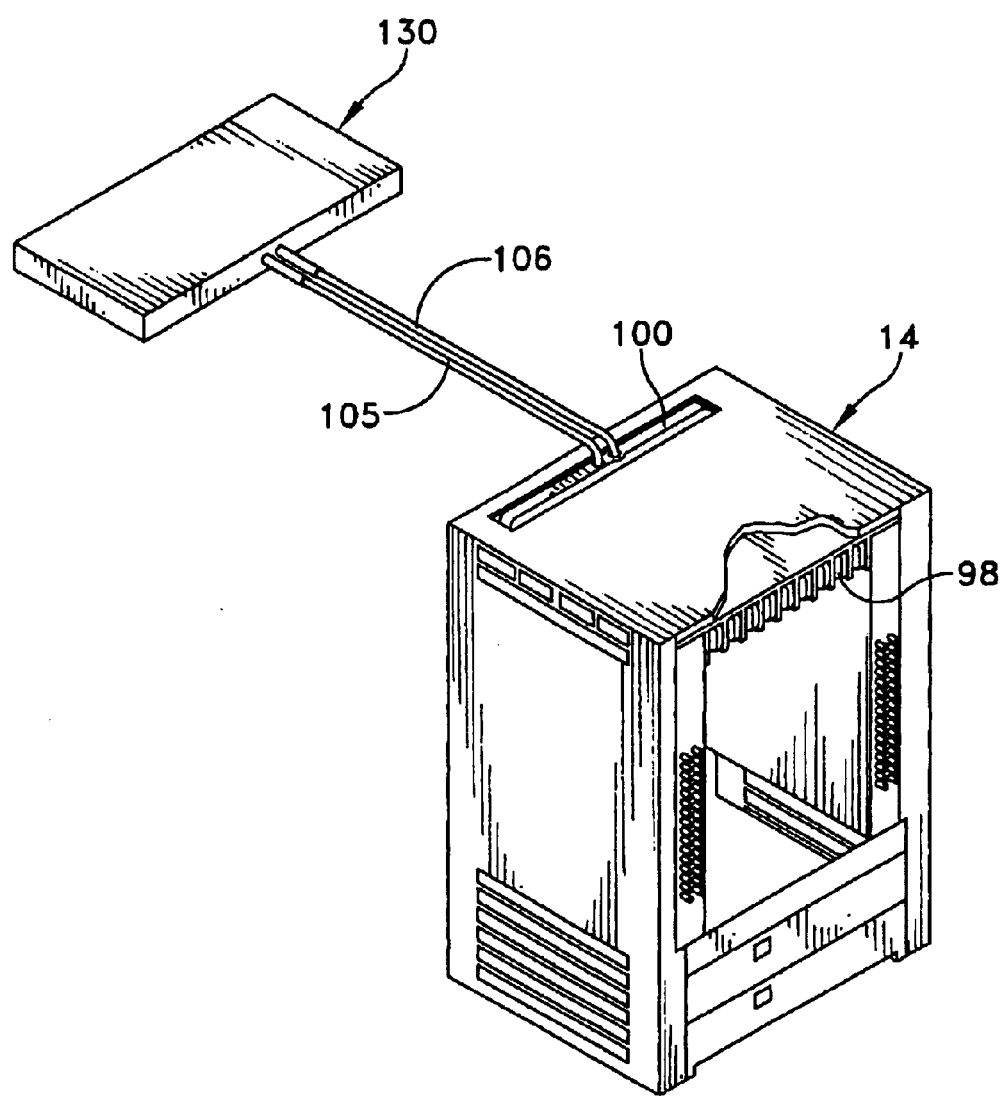
FIG. 12 is a perspective view of a typical electronic system having the evaporator blade and liquid cooled heat exchanger shown in FIG. 11, assembled therein.
Figure 13:
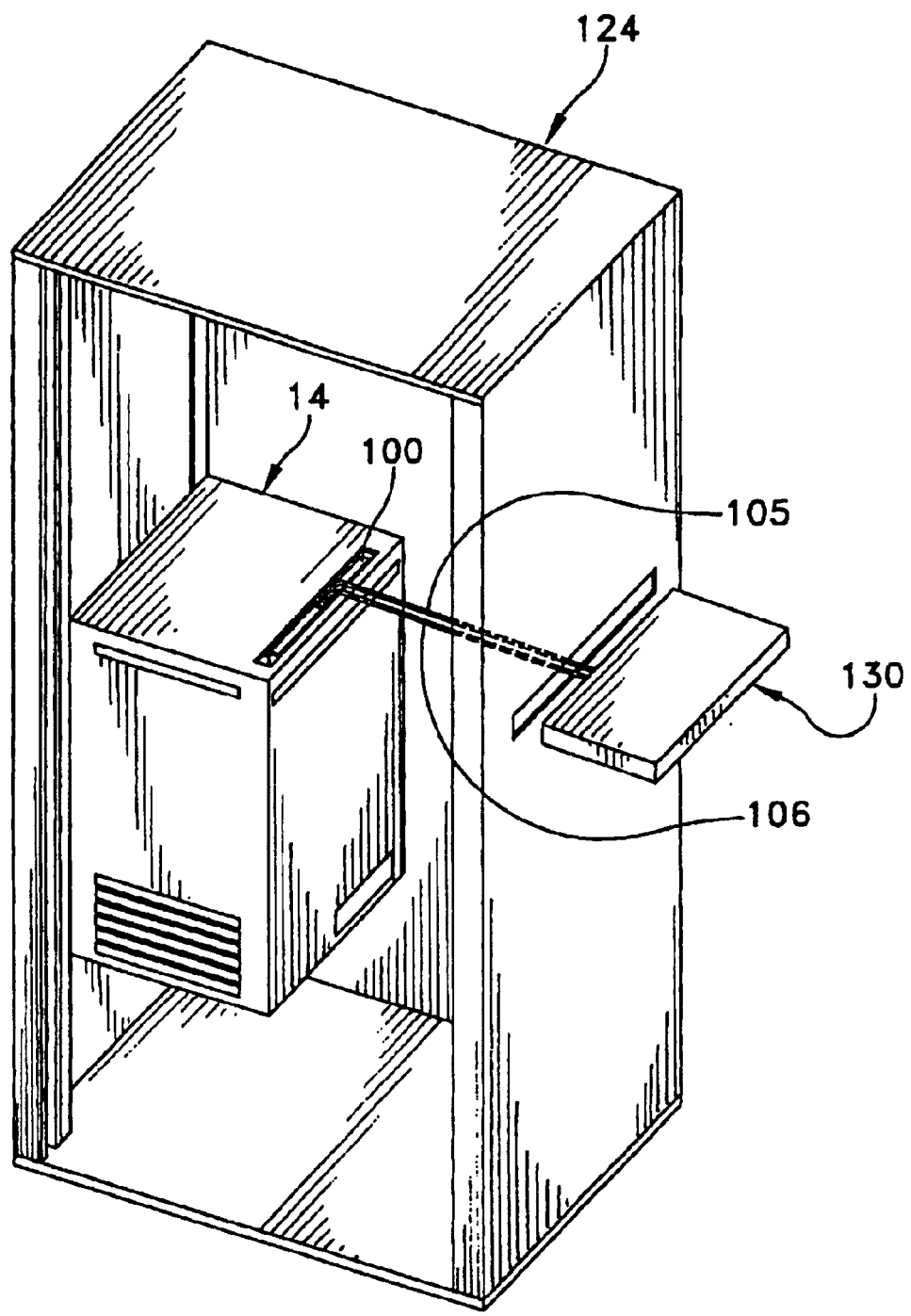
FIG. 13 is a perspective view of the electronic cabinet and thermal management system shown in FIG. 12, housed within a larger enclosure.
Figure 14:
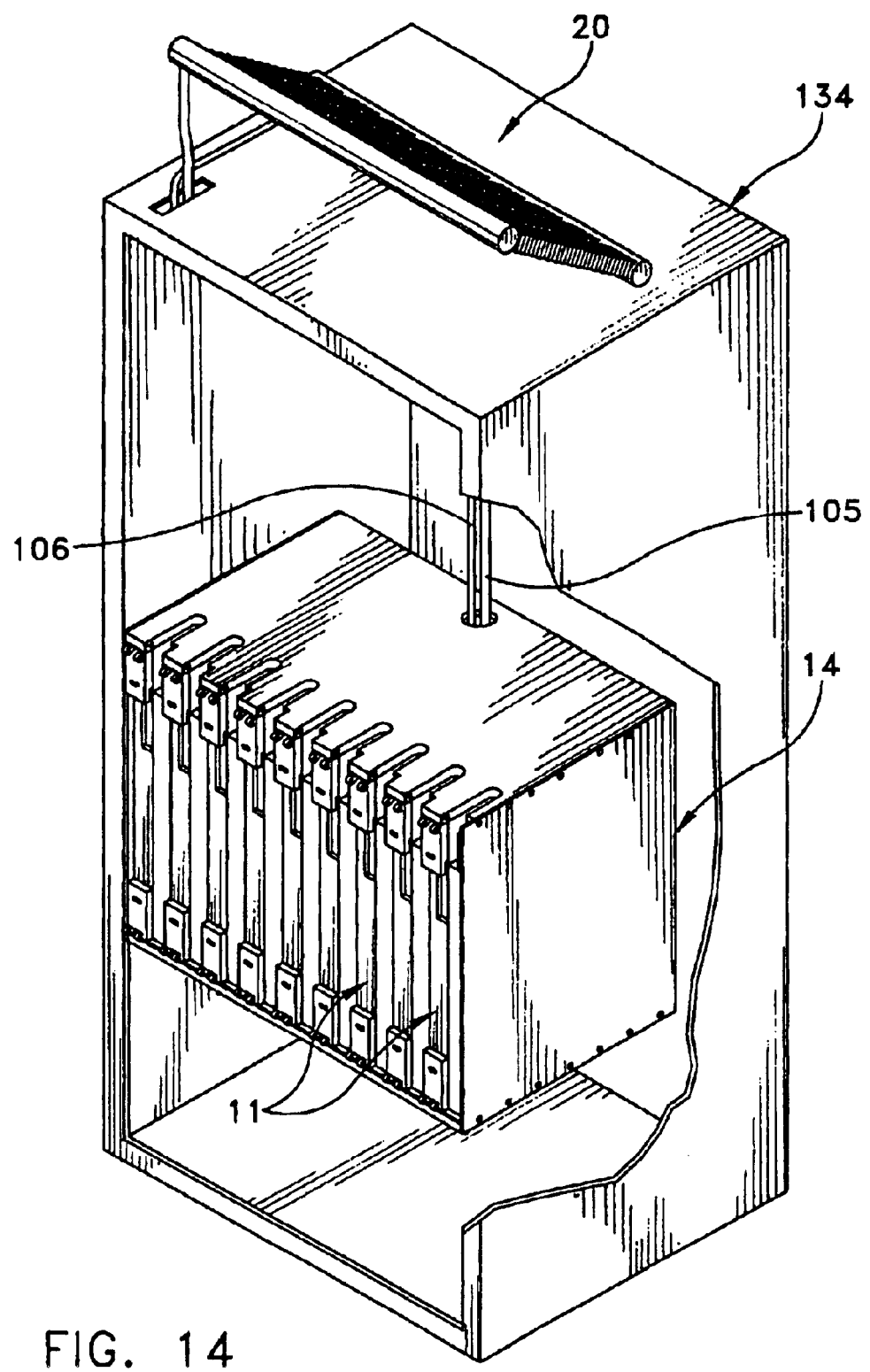
FIG. 14 is a further embodiment of the thermal management system of the present invention having a rack-level cooling assembly disposed on the top surface of an enclosure, more than one hundred centimeters from the remainder of the thermal management system.
Figure 15:
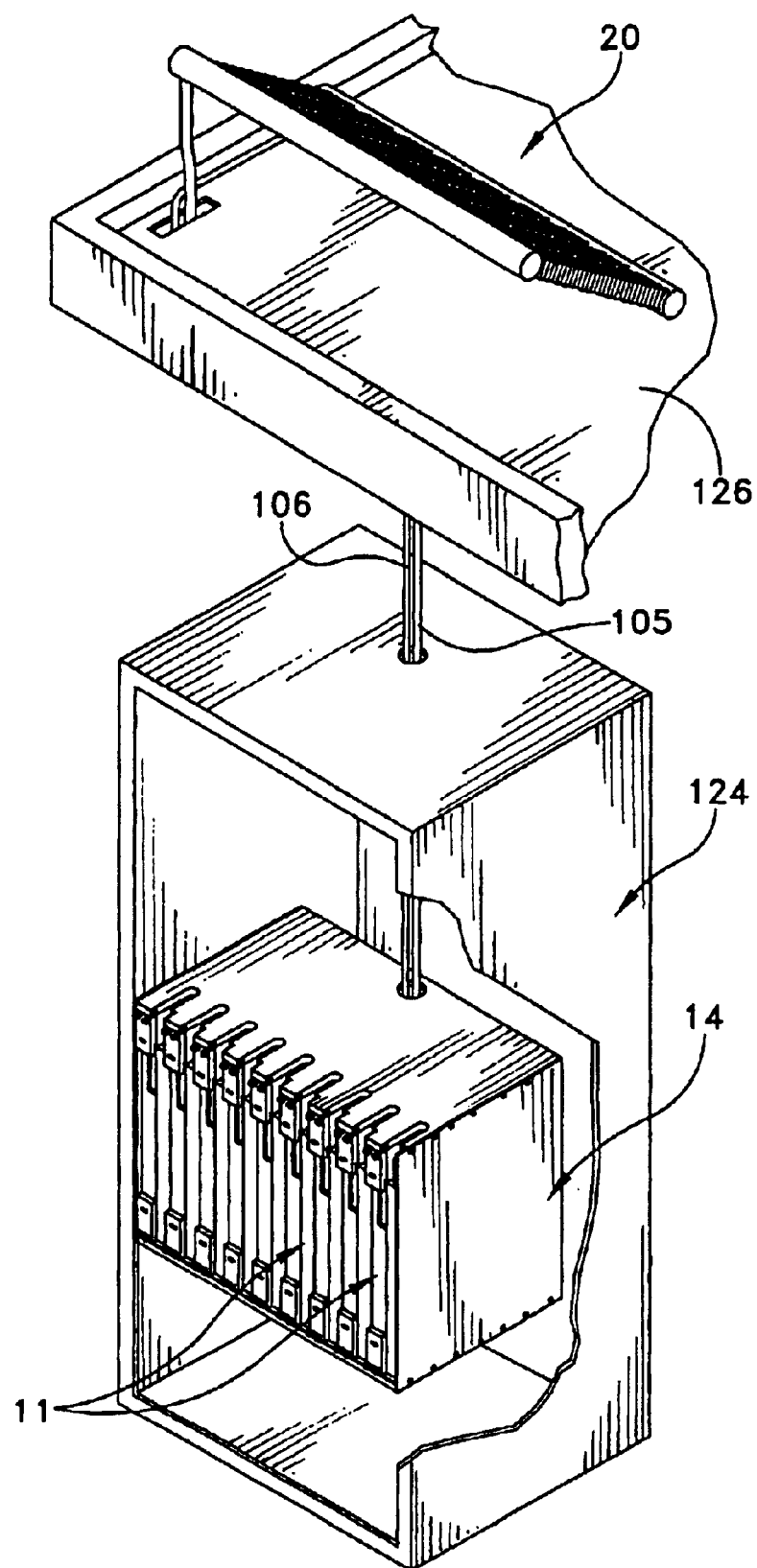
FIG. 15 is a perspective view, similar to FIG. 14, but with the rack-level cooling assembly positioned on the roof of a building.

Condenser 84 acts as a heat exchanger transferring heat contained in a mixture of vaporous coolant fluid and liquid coolant fluid to the ambient environment via convection. If sufficient space is available immediately above the rack containing card shells 11, then a modular system incorporating air cooled heat sinks such as condenser 84 are preferred (FIGS. 1 and 10). Condenser 84 may be located inside or outside of a cabinet or enclosure 124. If the heat is to be transferred to air, external locations that are spaced far away, i.e., by more than one hundred centimeters, allow the use of very large condensers 84 on, e.g., the roof 126 of a building, so heat may be efficiently dumped to the ambient air (FIG. 15).

In many applications, rack housing 14 is not fully filled with card shells 11 at initial installation. A rack housing 14 which accommodates, e.g., nine card shells, may be initially delivered with only three. The modularity of rack-level cooling assembly 20 permits individual installation so the initial number of loop thermosyphons matches the number of card shells 11. Additional loop thermosyphons 80 can be plugged in at any time when additional card shells 11 are added to rack housing 14.

Figure 18:
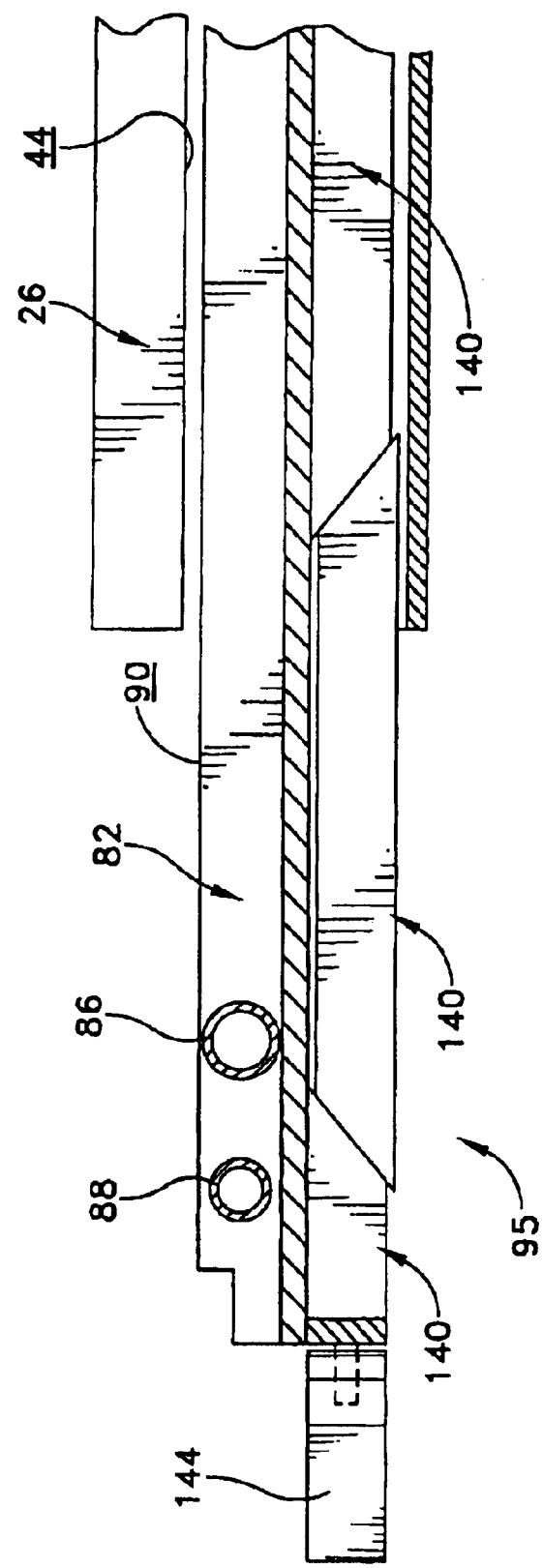
FIG. 18 is a broken-away, top elevational view of the present invention showing the first stage in the process of clamping a rack-level cooling assembly evaporator against a thermal connector portion of a card shell in accordance with the present invention.
Figure 19:
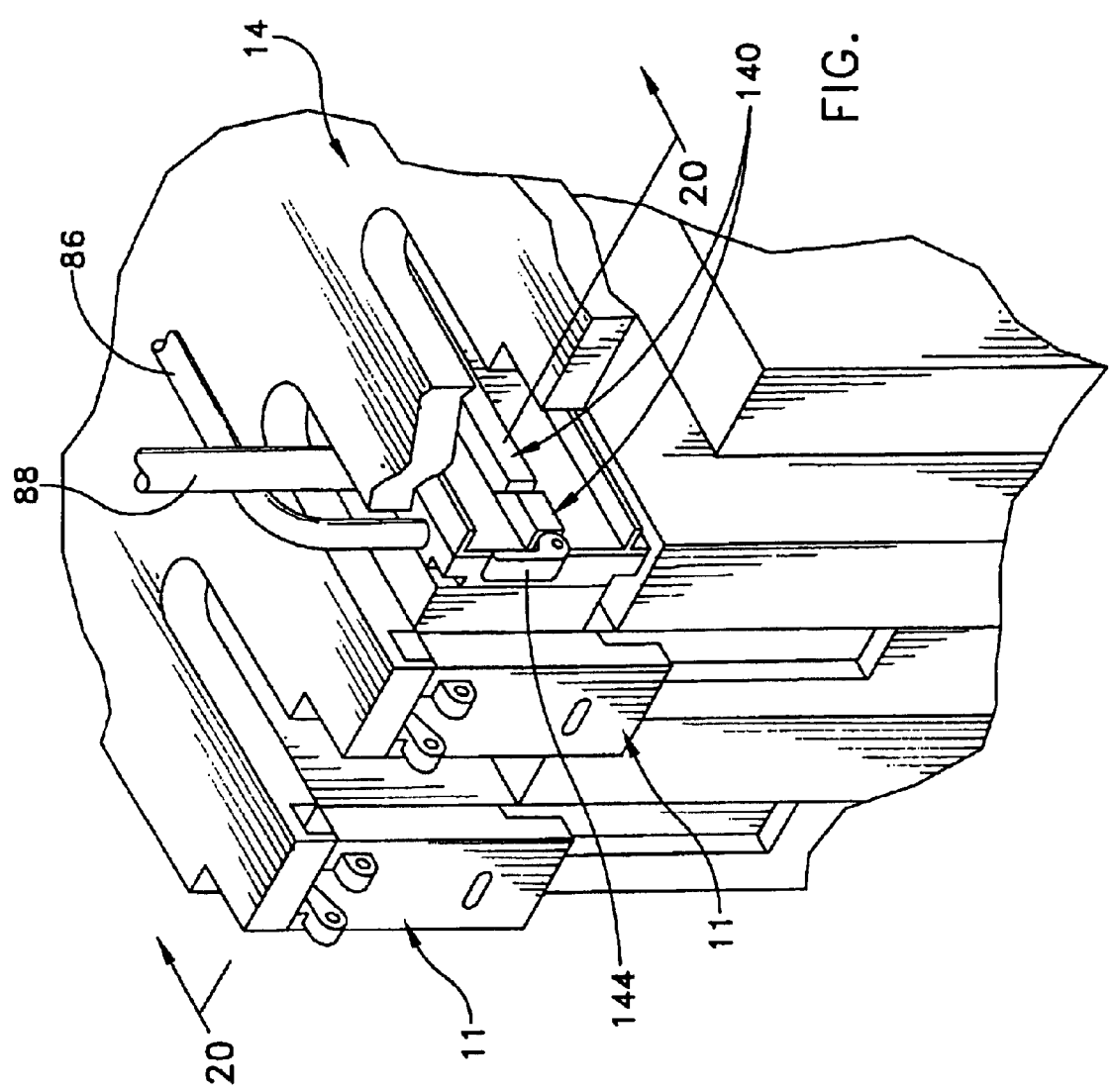
FIG. 19 is a broken-away perspective view of portions of a rack-level cooling assembly and clamping mechanism arranged in accordance with the present invention just after full insertion into a rack housing.

Rack-level cooling assembly 20 may be thermally, but releasably engaged with first card-level cooling assembly 16 and second card-level cooling assembly 18 by thermal engagement clamp assembly 95 (FIGS. 9 and 16). More particularly, thermal engagement clamp assembly 95 often comprises a wedge-lock type of clamp, e.g. the "card-lok" clamp manufactured by Calmark Corp of San Gabriel Calif., and disclosed in U.S. Pat. Nos. 5,224,016 and 4,819,713, which patents are hereby incorporated herein by reference. Typically thermal engagement clamp assembly 95 includes a plurality of trapazoidally shaped wedge members 140 that are arranged in an end to end fashion with successive wedge members being oppositely oriented. When wedge members 140 are compressed by the action of a lever 144 upon an internal shaft mechanism (not shown), wedge members 140 slide along their oppositely oriented faces. As this happens, thermal engagement clamp assembly 95 expands laterally so as to exert a lateral clamping force upon the side of evaporator 82 that is opposite third thermal transfer interface surface 90 (FIGS. 17 and 18). In this way, evaporator 82 is driven laterally toward an adjacent card shell 11 so that third thermal transfer interface surface 90 engages first thermal transfer interface surface 44 and second thermal transfer interface surface 69 in intimate thermal communication (FIGS. 19 and 20). A reasonable clamping pressure is essential to providing good thermal connections, but clamping must not be allowed to interfere with the insertion of a card shell 11, or with the making of electrical connections when the card is inserted. Releasing lever 144 removes the force holding wedges 140, thereby providing clearance for zero-interference removal of card shell 11.

It will also be understood that the location above rack of loop thermosyphon 80 allows a more efficient air flow than could be forced through the constricted space between card shells 11, and also permits the use of fin stacks (heat exchangers) that are much larger than could be mounted on or near the components being cooled. However, with the growing power levels being encountered in electronics cooling, heat will more typically be transferred to a liquid cooled heat sink. In an alternative embodiment, a conventional liquid cooled condenser 130 may be used when an air cooled condenser cannot be easily mounted on or near to electronic system 4, or will not have the capacity to handle the thermal energy transferred to it. Liquid cooled condenser 130 can utilize a circulating coolant, such as water or water/ethylene-glycol, or can be the chiller circuit of an HVAC system. Liquid cooled condensers 130 can also be very compact, and would generally be mounted to the outside of the cabinet housing electronics system 4, so that coolant is never introduced into the electronic rack housing 14. Such systems are often sized to dissipate about five kilowatts or so. With this embodiment of the invention, the cabinet can be hermetically sealed to avoid contamination by dust and dirt.

A compact liquid cooled condenser 130, combined with flexible sections 107 in the liquid and vapor lines allows a rack/chassis incorporating a thermal management system 2 to be modularly installed in an existing rack cabinet 14. The only physical change to the cabinet, other than mounting provisions, is cutting a slot in the rear panel of the cabinet.

It is to be understood that the present invention is by no means limited only to the particular constructions herein disclosed and shown in the drawings, but also comprises any modifications or equivalents within the scope of the claims.

What is claimed is:

1. A thermal bus junction arranged within an electronics system for transporting thermal energy in a directed manner from one location to another location comprising:

a cold plate having a portion of at least one heat pipe embedded within a first thermal interface surface; and an evaporator portion of a loop thermosyphon having a second thermal interface surface releasably pressed against said first thermal interface surface.

2. A thermal management system for an electronic device having one or more circuit cards arranged within an enclosure, said thermal management system comprising:

a first thermal energy transfer assembly that is thermally coupled between a heat generating structure located on a circuit card and a first thermal interface surface that is spaced away from said heat generating structure;

a second thermal energy transfer assembly having a second thermal interface surface arranged in confronting relation to said first thermal interface surface; and a clamping mechanism arranged to move said second thermal interface surface between (i) a first position that is spaced away from said first thermal interface surface, and (ii) a second position wherein said second thermal interface surface is pressed against said first thermal interface surface so as to allow the busing of thermal energy from said first thermal energy transfer assembly to said second thermal energy transfer assembly by heat transfer from said first thermal interface surface to said second thermal interface surface.

3. A thermal management system according to claim 2 wherein said thermal energy transfer assembly comprises a card level cooling assembly including at least one thermal saddle heat sink and a cold plate that defines said first thermal interface surface, said at least one thermal saddle heat sink and said cold plate being coupled together in thermal transfer communication with one another through a heat pipe.

4. A thermal management system according to claim 3 wherein of said thermal saddle is positioned atop an active, heat generating electronic component, so as to conductively receive operating heat, and includes a recessed slot defined in a top surface so as to receive a portion of said heat pipe.

5. A thermal management system according to claim 3 wherein said heat pipe includes at least one thermally conductive flag projecting outwardly from a portion thereof so as to provide a thermally conductive path to said heat pipe.

6. A thermal management system according to claim 5 wherein said flag comprises a heat pipe.

7. A thermal management system according to claim 3 wherein said cold plate comprises at least one channel defined in said first thermal interface surface.

8. A thermal management system according to claim 7 wherein a portion of said heat pipe is thermally engaged with said at least one channel.

9. A thermal management system according to claim 3 wherein said cold plate comprises a width of about one and three-quarter inches.

10. A thermal management system according to claim 8 wherein said channels have a substantially semi-circular bottom portion that is sized and shaped to tightly receive a partially flattened portion of said heat pipe.

11. A thermal management system according to claim 2 wherein said second thermal energy transfer assembly includes a rack-level cooling assembly comprising a plurality of modular loop thermosyphons that each include an evaporator and a condenser that are arranged in fluid communication with one another through a vapor conduit and a condensate conduit, wherein said second thermal interface surface is defined by a surface of said evaporator.

12. A thermal management system according to claim 11 wherein said second thermal interface surface comprises a width of about one and three-quarter inches.

13. A thermal management system according to claim 11 wherein said second thermal interface surface is sized and shaped so as to be complementary to at least said first thermal interface surface.

14. A thermal management system according to claim 11 wherein said vapor conduit and said condensate conduit have flexible sections.

15. A thermal management system according to claim 11 wherein said condenser comprises a vapor vessel and a liquid vessel that are arranged in fluid communication with one another through a plurality of conduits, with a plurality of fins positioned between said plurality of conduits.

16. A thermal management system according to claim 11 wherein said evaporator is located adjacent to said first thermal interface surface, and said condenser is spaced away from both said evaporator and said first thermal interface surface.

17. A thermal management system according to claim 16 wherein said condenser is spaced away from both said evaporator and said first thermal interface surface by more than one hundred centimeters.

18. A thermal management system according to claim 2 wherein said second thermal energy transfer assembly includes a rack-level cooling assembly comprising a loop thermosyphon that includes a condenser and a plurality of blade-evaporators that extend from a common manifold that is arranged in fluid communication with each blade-evaporator, said common manifold being arranged in fluid communication with a vapor conduit and a condensate conduit, wherein said second thermal interface surface is defined by a surface of each of said plurality of blade-evaporators.

19. A thermal management system according to claim 18 wherein said plurality of blade-evaporators are arranged in substantially perpendicular relation to said common manifold.

20. A thermal management system according to claim 18 wherein each blade-evaporator is joined to said common manifold so that vapor exits from each blade-evaporator to said common manifold and condensate is returned to said common manifold so as to be distributed to individual blade-evaporators.

21. A thermal management system according to claim 19 wherein a single vapor line and a single condensate line extend between said common manifold and a heat exchanger.

22. A thermal management system according to claim 21 wherein said single vapor line and said single condensate line comprise flexible sections.

23. A thermal management system according to claim 18 wherein each individual blade-evaporator is joined to said common header manifold by a flexible joint.

24. A thermal bus junction arranged within an electronics system for transporting thermal energy in a directed manner from one location to another location comprising:
    a condenser of a first loop thermosyphon having a first thermal interface surface; and
    an evaporator portion of a second loop thermosyphon having a second thermal interface surface releasably pressed against said first thermal interface surface.

25. A thermal management system for an electronic device having one or more circuit cards arranged within an enclosure, said thermal management system comprising:
    at least one card-level cooling assembly including at least one thermal saddle arranged in thermal engagement with a heat generating structure, a cold plate having a first thermal interface surface, and a heat pipe thermally coupled to said at least one thermal saddle and said cold plate;
    at least one heat exchanger having a second thermal interface surface arranged in confronting relation to said first thermal interface surface; and
    a clamping mechanism arranged to move said second thermal interface surface between (i) a first position that is spaced away from said first thermal interface surface, and (ii) a second position wherein said second thermal interface surface is pressed against said first thermal interface surface so as to allow the busing of thermal energy from said at least one card-level cooling assembly to said at least one heat exchanger by heat transfer from said first thermal interface surface to said second thermal interface surface.

26. A thermal management system according to claim 25 wherein a second one loop thermosyphon having a third thermal interface surface disposed upon a condenser is arranged adjacent to said at least one card-level cooling assembly and in confronting relation to said second thermal interface surface.

27. A thermal bus junction arranged within an electronics system for transporting thermal energy in a directed manner from one location to another location comprising:
    a cold plate having a portion of at least one heat pipe embedded within a first thermal interface surface
    a condenser of a first loop thermosyphon having a second thermal interface surface; and
    an evaporator portion of a second loop thermosyphon having a third thermal interface surface releasably pressed against said first and second thermal interface surfaces.

28. A thermal management system for an electronic device having one or more circuit cards arranged within an enclosure, said thermal management system comprising:
    at least one card-level cooling assembly including at least one thermal saddle arranged in thermal engagement with a heat generating structure, a cold plate having a first thermal interface surface, and a heat pipe thermally coupled to said at least one thermal saddle and said cold plate;

at least one loop thermosyphon having a second thermal interface surface disposed upon a evaporator and arranged in confronting relation to said first thermal interface surface; and a clamping mechanism arranged to move said second thermal interface surface between (i) a first position that is spaced away from said first thermal interface surface, and (ii) a second position wherein said second thermal interface surface is pressed against said first thermal interface surface so as to allow the busing of thermal energy from said at least one card-level cooling assembly to said at least one loop thermosyphon by heat transfer from said first thermal interface surface to said second thermal interface surface.

29. A thermal management system for an electronic device having one or more circuit cards arranged within an enclosure, said thermal management system comprising:

at least one card-level cooling assembly including at least one loop thermosyphon having a first thermal interface surface disposed upon a condenser;

at least a second loop thermosyphon having a second thermal interface surface disposed upon a second evaporator and arranged in confronting relation to said first thermal interface surface; and a clamping mechanism arranged to move said second thermal interface surface between (i) a first position that is spaced away from said first thermal interface surface, and (ii) a second position wherein said second thermal interface surface is pressed against said first thermal interface surface so as to allow the busing of thermal energy from said at least one card-level cooling assembly to said at least a second loop thermosyphon by heat transfer from said first thermal interface surface to said second thermal interface surface.

30. A thermal management system for an electronic device having one or more circuit cards arranged within an enclosure, said thermal management system comprising:

a first thermal energy transfer assembly that is thermally coupled between a heat generating structure located on a circuit card and a first thermal interface surface that is spaced away from said heat generating structure;

a second thermal energy transfer assembly that is thermally coupled between a heat generating structure located on a circuit card and a second thermal interface surface that is spaced away from said heat generating structure;

a third thermal energy transfer assembly having a third thermal interface surface arranged in confronting relation to said first and second thermal interface surfaces; and a clamping mechanism arranged to move said third thermal interface surface between (i) a first position that is spaced away from said first and second thermal interface surfaces, and (ii) a second position wherein said third thermal interface surface is pressed against said first and second thermal interface surfaces so as to allow the busing of thermal energy from said first and second thermal energy transfer assemblies to said third thermal energy transfer assembly by heat transfer from said first and second thermal interface surfaces to said third thermal interface surface.

31. A thermal management system for an electronic device having one or more circuit cards arranged within an enclosure, said thermal management system comprising:

a first thermal energy transfer assembly that is thermally coupled between a heat generating structure located on a circuit card and a first thermal interface surface that is spaced away from said heat generating structure, and has an exposed height of about one and three-quarter inches;

a second thermal energy transfer assembly that is thermally coupled between a heat generating structure located on a circuit card and a second thermal interface surface that is spaced away from said heat generating structure and has an exposed height of about one and three-quarter inches;

a third thermal energy transfer assembly having a third thermal interface surface arranged in confronting relation to said first and second thermal interface surfaces, and has an exposed height of about one and three-quarter inches; and a clamping mechanism arranged to move said third thermal interface surface between (i) a first position that is spaced away from said first and second thermal interface surfaces, and (ii) a second position wherein said third thermal interface surface is pressed against said first and second thermal interface surfaces so as to allow the busing of thermal energy from said first and second thermal energy transfer assemblies to said third thermal energy transfer assembly by heat transfer from said first and second thermal interface surfaces to said third thermal interface surface.

32. A thermal management system according to claim 31 wherein said thermal energy transfer assembly comprises a card level cooling assembly including at least one thermal saddle heat sink and a cold plate that defines said first thermal interface surface, said at least one thermal saddle heat sink and said cold plate being coupled together in thermal transfer communication with one another through a heat pipe.

33. A thermal management system according to claim 32 wherein of said thermal saddle is positioned atop an active, heat generating electronic component, so as to conductively receive operating heat, and includes a recessed slot defined in a top surface so as to receive a portion of said heat pipe.

34. A thermal management system according to claim 32 wherein said heat pipe includes at least one thermally conductive flag projecting outwardly from a portion thereof so as to provide a thermally conductive path to said heat pipe.

35. A thermal management system according to claim 34 wherein said flag comprises a heat pipe.

36. A thermal management system according to claim 33 wherein said cold plate comprises at least one channel defined in said first thermal interface surface.

37. A thermal management system according to claim 36 wherein a portion of said heat pipe is thermally engaged with said at least one channel.

38. A thermal management system according to claim 31 wherein said second thermal energy transfer assembly includes a rack-level cooling assembly comprising a plurality of modular loop thermosyphons that each include an evaporator and a condenser that are arranged in fluid communication with one another through a vapor conduit and a condensate conduit, wherein said second thermal interface surface is defined by a surface of said evaporator.

* * * * *